US008422242B2

(12) United States Patent
Lin (10) Patent No.: US 8,422,242 B2
(45) Date of Patent: Apr. 16, 2013

(54) STRUCTURE FOR FIXING CIRCUIT BOARD (75) Inventor: Linger Lin, Taipei (TW)

(73) Assignee: Inventec Corporation, Taipei (TW)

(*) Notice: Subject to any disclaimer, the term of this patent is extended or adjusted under 35 U.S.C. 154(b) by 287 days.

(21) Appl. No.: 13/009,142

(22) Filed: Jan. 19, 2011

(65) Prior Publication Data

US 2012/0081862 A1   Apr. 5, 2012

(30) Foreign Application Priority Data

Oct. 5, 2010 (TW) ................. 99133788 A (51) Int. Cl.
| H05K 5/00 | (2006.01) |
| H05K 1/00 | (2006.01) |
| H05K 1/18 | (2006.01) |
| H05K 7/00 | (2006.01) |
| H01R 13/62 | (2006.01) |

(52) U.S. Cl.
USPC ............................ 361/759; 361/748; 439/327

(58) Field of Classification Search .................. None
See application file for complete search history.

(56) References Cited

U.S. PATENT DOCUMENTS

| 5,452,184 | A  | * | 9/1995  | Scholder et al. | 361/799 |
| 6,327,160 | B1 | * | 12/2001 | Liao | 361/809 |
| 6,544,063 | B2 | * | 4/2003  | Cadio | 439/327 |
| 6,625,041 | B1 | * | 9/2003  | Chen | 361/829 |
| 6,726,505 | B2 | * | 4/2004  | Cermak et al. | 439/567 |
| 6,751,102 | B1 | * | 6/2004  | Chen | 361/758 |
| 6,853,556 | B1 | * | 2/2005  | Myers et al. | 361/754 |
| 6,985,367 | B1 | * | 1/2006  | Scigiel | 361/801 |
| 7,085,141 | B2 | * | 8/2006  | Yi | 361/804 |
| 7,292,458 | B1 | * | 11/2007 | Chern et al. | 361/807 |
| 7,505,286 | B2 | * | 3/2009  | Brovald et al. | 361/804 |
| 7,529,092 | B2 | * | 5/2009  | Testin et al. | 361/704 |
| 7,554,815 | B2 | * | 6/2009  | Hardt et al. | 361/753 |
| 7,593,240 | B2 | * | 9/2009  | Kao | 361/807 |
| 8,130,489 | B2 | * | 3/2012  | Chan et al. | 361/679.32 |
| 2002/0070657 | A1 | * | 6/2002 | Park | 313/440 |
| 2004/0017669 | A1 | * | 1/2004 | Li et al. | 361/760 |
| 2004/0095733 | A1 | * | 5/2004 | Cheng et al. | 361/759 |
| 2004/0125576 | A1 | * | 7/2004 | Lin et al. | 361/759 |
| 2005/0191870 | A1 | * | 9/2005 | Holt et al. | 439/66 |
| 2006/0114662 | A1 | * | 6/2006 | Liu et al. | 361/759 |
| 2007/0242442 | A1 | * | 10/2007 | Dai | 361/801 |
| 2009/0231817 | A1 | * | 9/2009 | Xue | 361/759 |
| 2009/0244862 | A1 | * | 10/2009 | Wu et al. | 361/759 |
| 2009/0244863 | A1 | * | 10/2009 | Kuo et al. | 361/760 |

FOREIGN PATENT DOCUMENTS

| TW | 449233 | 8/2001 |
| TW | 248565 | 2/2006 |
| TW | 264972 | 10/2006 |

* cited by examiner

Primary Examiner — Lisa Lea Edmonds
Assistant Examiner — Xanthia C Cunningham
(74) Attorney, Agent, or Firm — WPAT PC; Justin King (57) ABSTRACT

A structure for fixing circuit board, adapted for fixing a circuitboard at the rear of a cage, is disclosed, which comprises: a circuitboard; and a clamp, configured with a clipping part, a fixing part and an elastic part; wherein, the clipping part is coupled to the fixing part while the fixing part is coupled to the elastic part; the clipping part has a first hook formed at a surface facing toward the fixing part; the elastic part has a second hook formed extruding out form a surface facing away from the fixing part; the clipping part and the fixing part are arranged straddling across the top edge of the circuitboard while enabling the first hook to couple to a fastener of the circuitboard; and the elastic part is arranged facing toward the cage while enabling the second hook to secure to the bottom of the cage.

10 Claims, 7 Drawing Sheets

STRUCTURE FOR FIXING CIRCUIT BOARD

FIELD OF THE INVENTION

The present invention relates to a circuitboard fixing structure, and more particularly, to a fixing structure featured not only for its simplicity in structure and easiness of installment, but also for its capability of fixedly securing a circuitboard while allowing the circuitboard to be detached conveniently.

BACKGROUND OF THE INVENTION

Generally, it is usual to have a middle plane arranged between the hard disk drive (HDD) cage and the motherboard (MB) in a common server so as to be used for interfacing the MB with the HDD cage. Moreover, the middle plane is usually being configured with a plurality of connectors, which are provided for connecting electrically to hard disk drives. It is noted that such middle plane is generally being arranged perpendicular to the base of the server and is fixedly secured to the rear of the HDD cage.

In addition, the connection between the middle plane and the MB is achieved by means of a board-to-board (BTB) connector, or by the use of cables or golden fingers for connecting connectors respectively configured on the middle plane and the MB. Nevertheless, no matter in what way the middle plane is connected to the MB, it is required that the middle plane is fixedly secured to the rear of the HDD cage.

Conventionally, the fixing of the middle plane to the rear of the HDD cage is achieved by the clipping parts mounted on the HDD cage. That is, for installing a middle plane, the middle plane will be arranged to engage with the sloping ramp structures of the clipping parts for forcing the same to yield elastically, and then, as soon as the middle plane is fed to a specific location, the yielded clipping parts will bounce back to its original position so as to hold and secure the middle plane at the specific location. Since the middle plane is usually formed with a width equal to that of the server where it is being installed, it will require two or even more than three such clipping parts so as to stably and fixedly secure the middle plane. Consequently, when it is required to detach the middle plane, users must force those clipping parts to yield one by one so as to release the middle plane that not only is not easy to enforce, but also may waste a conceivable amount of time.

SUMMARY OF THE INVENTION

In view of the disadvantages of prior art, the primary object of the present invention is to provide a circuitboard fixing structure featured not only for its simplicity in structure and easiness of installment, but also for its capability of fixedly securing a circuitboard while allowing the circuitboard to be detached conveniently.

To achieve the above object, the present invention provides a structure for fixing circuitboards at the rear of a cage, which comprises:
 a circuitboard, formed with a top edge and a bottom edge while being configured with at least one fastener; and
 a clamp, configured with at least one clipping part, at least one fixing part and at least one elastic part;
 wherein, the clipping part is coupled to the fixing part at their tops while the fixing part is coupled to the elastic part at their bottoms; the clipping part has a first hook formed at a surface thereof facing toward the fixing part; the elastic part has a second hook formed extruding out form a surface thereof facing away from the fixing part; the clipping part and the fixing part are arranged straddling across the top edge of the circuitboard while enabling the first hook to couple to the fastener of the circuitboard; and the elastic part is arranged facing toward the cage while enabling the second hook to engage with and thus couple to the bottom surface of the cage at a position near the top thereof.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
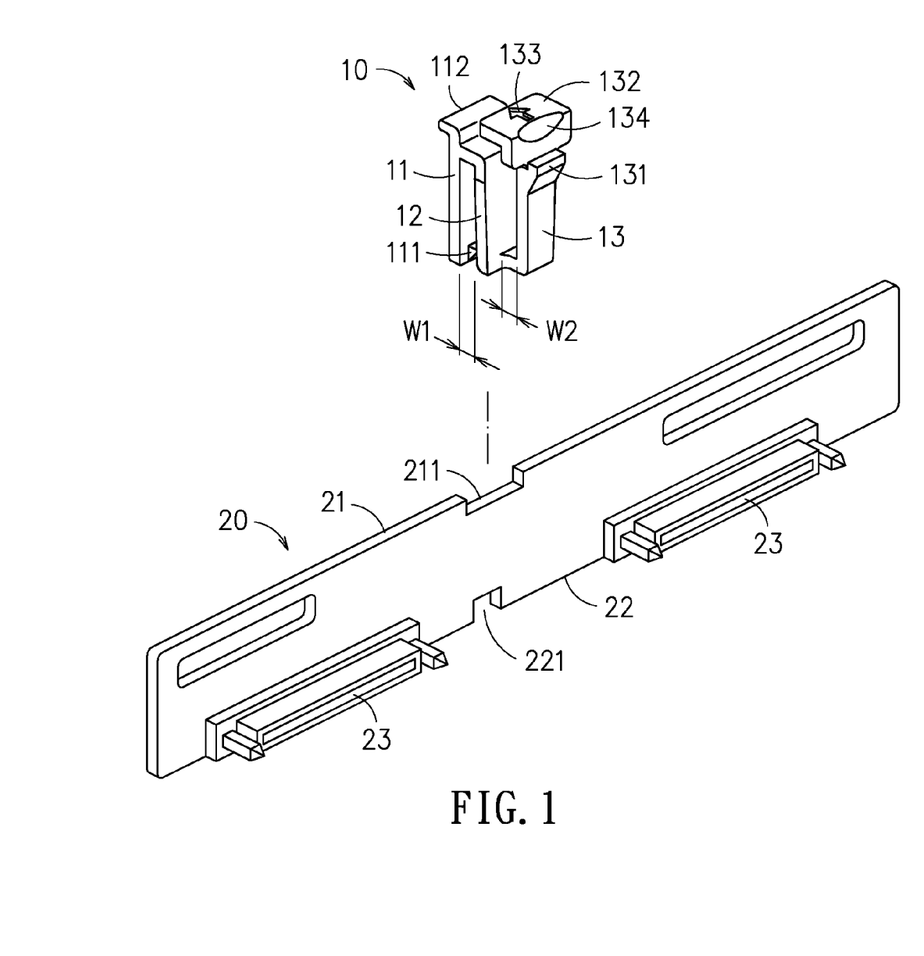
FIG. 1 is an exploded view of a circuitboard fixing structure according to a first embodiment of the present invention.

Please refer to FIG. 1, which is an exploded view of a circuitboard fixing structure according to a first embodiment of the present invention. In FIG. 1, a circuitboard fixing structure includes a clamp 10, which is used for holding a vertically disposed circuitboard 20, whereas the circuitboard 20 is formed with a top edge 21 and a bottom edge 22. In addition, the circuitboard 20 further comprises: a recess 211, formed on the top edge 21; a slot 221, formed on the bottom edge 22; and a plurality of connectors, mounted on a side surface of the circuitboard 20. It is noted that the circuitboard 20 can be a middle plane, and is usually being arranged perpendicular to a server base while being fixedly secured to the rear of the HDD cage. Thus, the circuitboard 20 is disposed in a manner that the side surface of the circuitboard 20 where the plural connectors 23 are mounted is positioned facing toward the HDD cage for providing easy access to any hard disk drive to electrically connect to any of the plural connectors 23.

Figure 2:
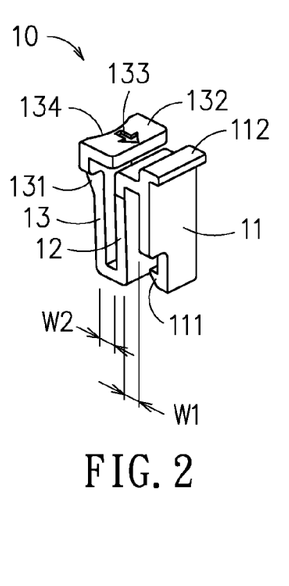
FIG. 2 is a three-dimensional view of a clamp used in the embodiment of FIG. 1.

As shown in FIG. 1 and FIG. 2, the clamp 10 configured with a clipping part 11, a fixing part 12 and an elastic part 13, which are all formed as rectangular plate-like structures whose lengths are significantly larger than their widths.

Moreover, the clipping part 11, the fixing part 12 and the elastic part are disposed parallel with each other; the clipping part 11 is coupled to the fixing part 12 at their tops while enabling the clipping part 11 to be spaced from the fixing part 12 by a first interval W1 that is about equal to the thickness of the circuitboard 20; and the clipping part 11 has a first hook 111 formed at a surface thereof facing toward the fixing part 12. Moreover, the fixing part 12 is coupled to the elastic part 13 at their bottoms while enabling the fixing part 12 to be spaced from the elastic part 13 by a second interval W2. As shown in FIG. 1, the clipping part 11 is formed with a first plate 112 at the top thereof in a manner that the first plate 112 is transversely extending and thus protruding out of a surface of the clipping part 11 facing away from the fixing part 12 while enabling an included angle of 90 degrees to be formed between the first plate 112 and the clipping part 11; and also the elastic part 13 has a second hook 131 formed extruding out form a surface thereof facing away from the fixing part 12. In addition, the elastic part 13 is formed with a second plate 132 at the top thereof in a manner that the second plate 132 is transversely extending and thus protruding out of a surface of the clipping part 11 facing toward the fixing part 12 while enabling an included angle of 90 degrees to be formed between the second plate 132 and the elastic part 13.

Figure 3:
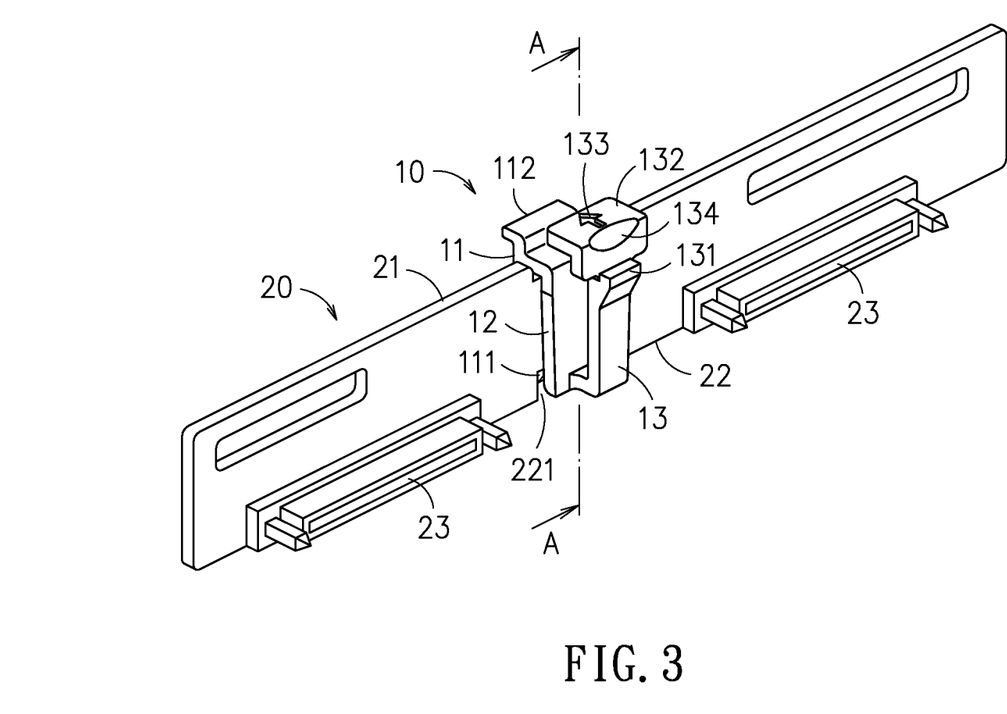
FIG. 3 is a three-dimensional diagram showing the circuitboard fixing structure of FIG. 1.
Figure 4:
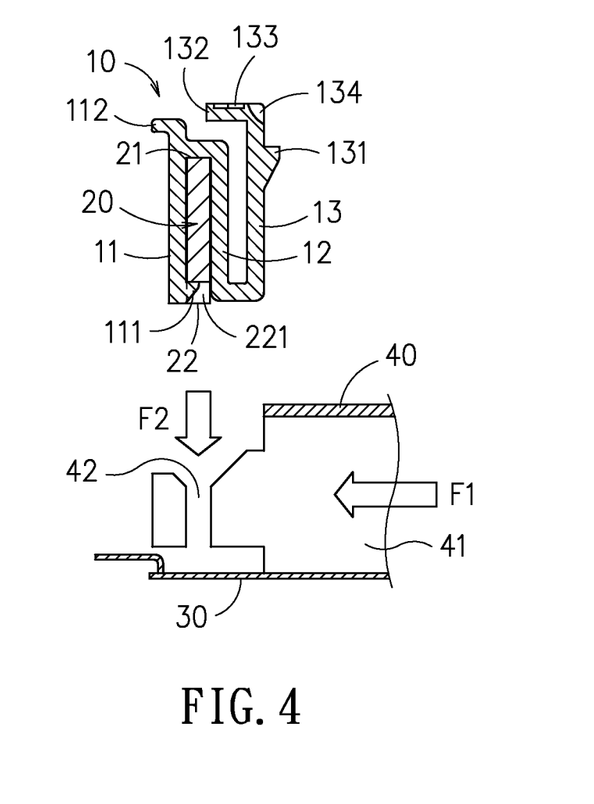
FIG. 4 and FIG. 5 are A-A sectional diagrams showing respectively a clamp of FIG. 3 that is detached from a HDD cage and is engaged with the HDD cage.

As shown in FIG. 1, FIG. 3 and FIG. 4, when the clamp 10 is clipped to the circuitboard 20, the clipping part 11 and the fixing part 12 are arranged straddling across the top edge 21 of the circuitboard 20 at a position corresponding to the recess 211 while enabling the first hook 111 to couple to the slot 221 at the bottom edge 22 of the circuitboard 20, so that the clamp 10 can be securely integrated with the circuitboard 20 as a unit. It is noted that during the assembling of the clamp 10 and the circuitboard 20, the elastic part 13 of the clamp 10 must be orientated in a position corresponding to the side surface of the circuitboard 20 where the connectors 23 are mounted, and thus, for ensuring and enhancing the correctness of the assembly, there is an arrow mark 133 formed on top of the second plate 132 for indicating the correct direction of installment.

Figure 5:
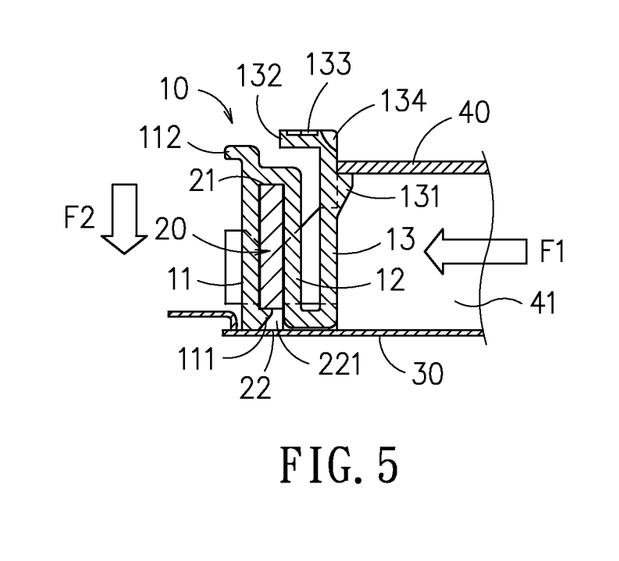

Please refer to FIG. 4 and FIG. 5, which are A-A sectional diagrams showing respectively a clamp of FIG. 3 that is detached from a HDD cage and is engaged with the HDD cage. In FIG. 4 and FIG. 5, there is a HDD cage 40 mounted on a server base 30, in that there is an accommodation space 41 provided in the HDD cage 40 to be used for receiving a hard disk drive in a manner that the hard disk drive can be inserted into the HDD cage 40 in a first direction F1. In addition, the HDD cage 40 is formed with an insert 42 at an end thereof, whereas the insert 42 is featured by an inserting direction that is parallel to a second direction F2. Thereby, the assembly of the circuitboard 20 and the clamp 10 can be inserted into the insert 42 following the second direction F2, while maintaining the side surface of the circuitboard 20 where the connectors are mounted to face toward the HDD cage 40. Consequently, the second hook 131 of the elastic part 13 is enabled to face toward the HDD cage 40 so that the second hook 131 is engaged with and thus coupled to the inner surface of the top side of the HDD cage 40, while allowing the second plate 132 at the top of the elastic part 13 to protrude out from the top side of the HDD cage 40. As shown in FIG. 5, by the restriction of the slot 42, the circuitboard is limited and thus prevented from moving in a horizontal direction, i.e. in a direction parallel with the first direction F1; and also by the coupling of the second hook 131 to the inner surface of the top side of the HDD cage 40, the circuitboard is further being limited from moving in a vertical direction, i.e. in a direction parallel with the second direction F2.

Figure 6:
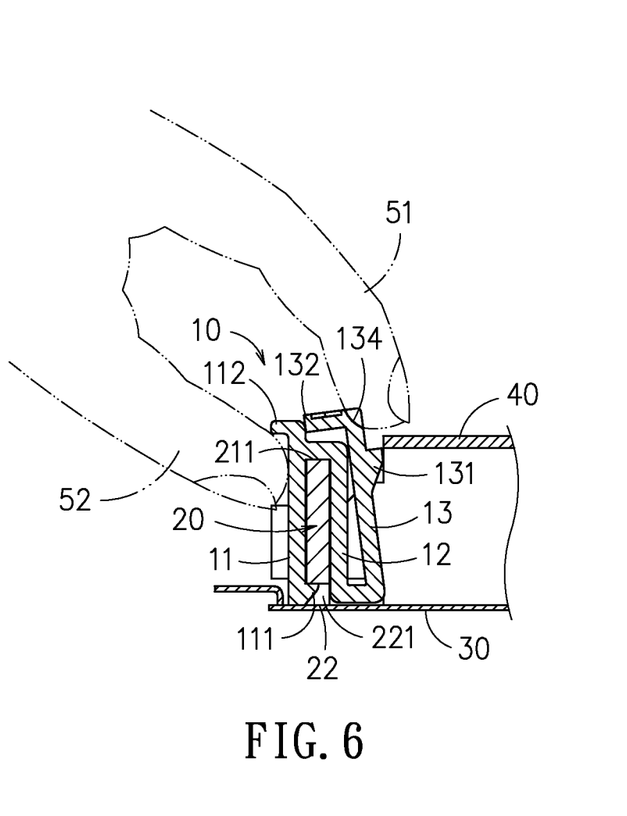
FIG. 6 and FIG. 7 are schematic diagrams showing how the fixing structure of FIG. 3 can be detached from a HDD cage sequentially.
Figure 7:
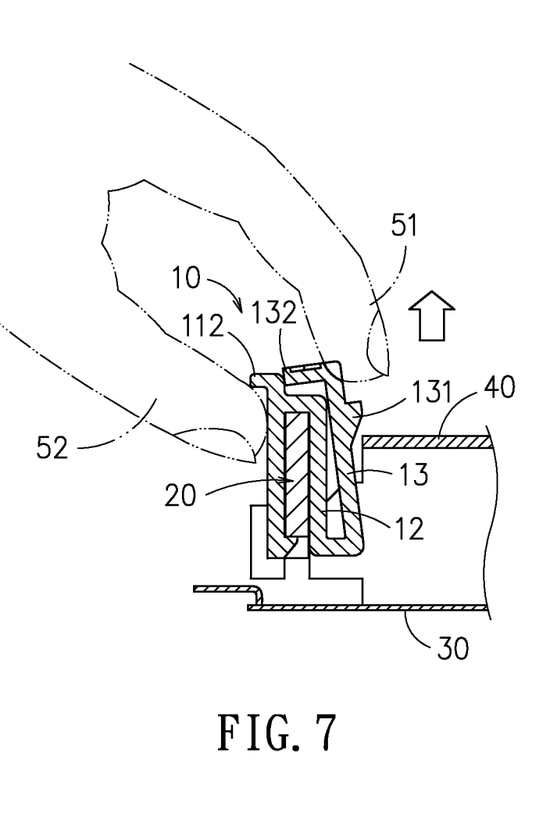

Please refer to FIG. 6 and FIG. 7, which are schematic diagrams showing how the fixing structure of FIG. 3 can be detached from a HDD cage sequentially. As shown in FIG. 6 and FIG. 7, for detaching the circuitboard 20 from the server base 30, an user will push the second plate 132 on top of the elastic part 13 using his/her index finger 51 for forcing the elastic part 13 to move toward the fixing part 12 so as to disengage the second hook 131 from the HDD cage 40. Accordingly, the depth relating to the coupling between the second hook 131 to the HDD cage 40 should be smaller than the second interval W2 between the fixing part 12 and the elastic part 13. After the second hook 131 is disengaged from the HDD cage 40, the user will press another finger of his/her, such as the thumb 52, upon the bottom of the first plate 112 so as to withdraw the clamp 10 along with the circuitboard 20 from the server base 30.

As the embodiments shown in FIG. 1 and FIG. 6, the first plate 112 is provided for the user's finger 52 to press thereupon and thus enhancing the friction required for pulling the clamp 10 upward. Therefore, the first plate 112 can be a flange of any shape that is formed protruding out of a surface of the clipping part 11 facing away from the fixing part 12, i.e. the is no limitation relating to the configuration of the first plate 112. Moreover, as shown in FIG. 1, the portion of the elastic part 13 above the position of the second hook 131 is formed wider than other portions, and the second plate 132 that is extending from the top thereof is formed of the same wider width while allowing an arc-shape concave 134 to be formed at the joint of the elastic part 13 and the second plate 132. The arc-shape concave 134 is constructed as a triggering element conforming to the shape of the finger 51 so as to provide a larger contact area. Nevertheless, the shape and size of the trigger element are not limited by the embodiment shown in FIG. 1. With the matching of the clamp 10 and the circuitboard 20 in size, the clamp can be clipped directly to the top edge 21 and the bottom edge 22 of the circuitboard 20, while enabling the recess 211 on the top edge 21 and the slot 221 on the bottom edge 22 to be used for preventing the clamp 10 from any displacement and sliding relative to the circuitboard 20. In addition, by designing the recess 211 and the slot 221 on the top edge 21 and the bottom edge 22 in respective, the volume of the clamp 10 can be reduced without significantly reduction in functionality. Moreover, the recess 211 and the slot 221 are both preferred to be disposed at the middle of the circuitboard 20, by that it is easier to maintain the balance of the circuitboard 20 while being pulled. It is noted that the circuitboard 20 can be formed with fasteners other than the recess 211 and the slot 221, only if they can provide the same functionalities.

Figure 8:
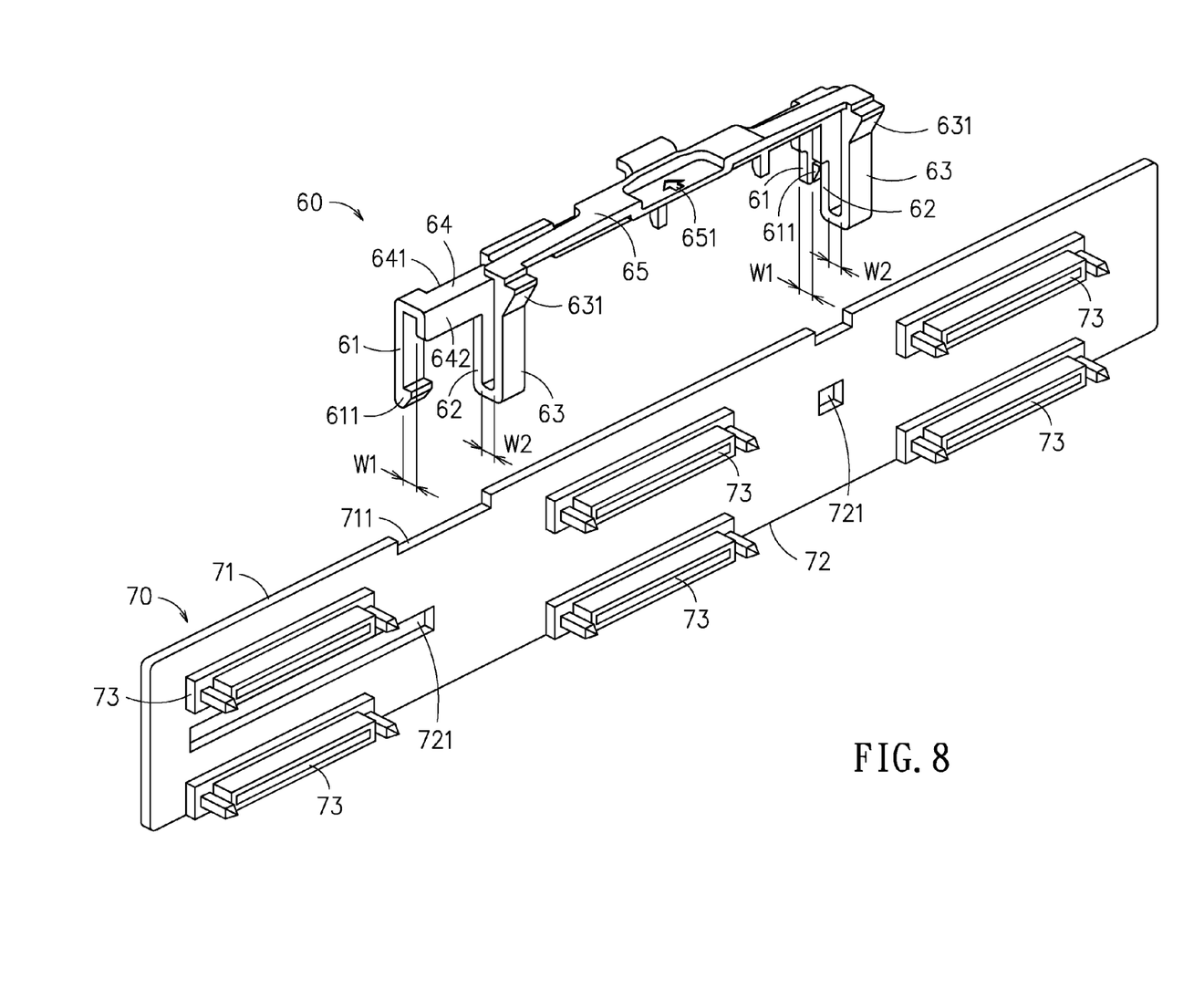
FIG. 8 is an exploded view of a circuitboard fixing structure according to a second embodiment of the present invention.

Please refer to FIG. 8, which is an exploded view of a circuitboard fixing structure according to a second embodiment of the present invention. Similarly, the circuitboard fixing structure includes a clamp 60, which is used for holding a vertically disposed circuitboard 70, but is different from the embodiment shown in FIG. 1 in that: there are only two connectors 23 mounted on the circuitboard 20 of FIG. 1, but there are six mounted on the circuitboard 70 of the present embodiment so that not only the size of the circuitboard 70 is larger, but also the clamp 60 matching with this larger circuitboard 70 is different from the clamp 10 used in the first embodiment.

Figure 9:
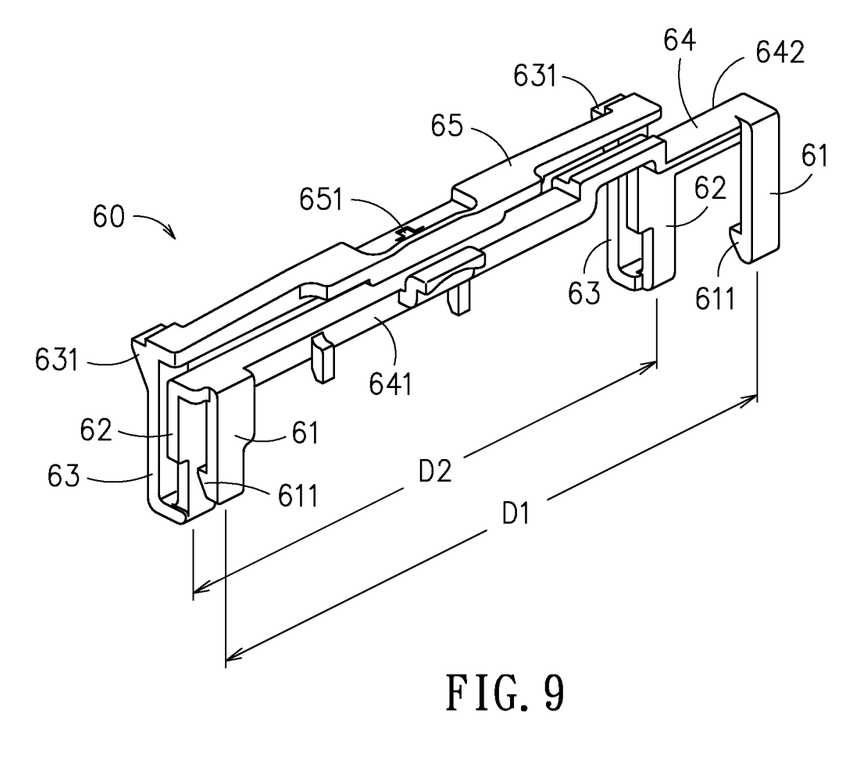
FIG. 9 is a three-dimensional view of a clamp used in the embodiment of FIG. 8.

As shown in FIG. 8 and FIG. 9, the clamp 60 is configured with two clipping parts 61, two fixing parts 62 and two elastic parts 63; each of the clipping parts 61 is spaced from its corresponding fixing part 62 by a first interval W1; and each clipping part 61 has a first hook 611 formed at a surface thereof facing toward the corresponding fixing part 62. Moreover, the tops of the two clipping parts 61 are coupled to the tops of the two fixing parts 62 in respective through a first connecting rod 64; the first connecting rod 64 is formed with a first extending length, and following the extending direction of the first connecting rod 64 respectively at the two sides of the first connecting rod 64, there are two side sections 641, 642 being defined that are opposite to each other while enabling the two clipping parts 61 to be disposed at one of the two side sections, i.e. the side section 641, and the two fixing parts 62 to be disposed at the opposite side section, i.e. the side section 642, as the two clipping parts 61 are to be spaced from each other by a first distance D1, and the two fixing parts 62 are to be spaced from each other by a second distance D2, while the first distance D1 is not equal to the second distance D2. In addition, the two elastic parts 63 are connected respectively to two fixing parts 62 while enabling the tops of the two elastic parts 63 to coupled to each other through a second connecting rod 65; and the second connecting rod 65 is formed with a second extending direction which is extending in a direction parallel with that of the first connecting rod 64. There circuitboard 70 of the present embodiment is configured with two recesses 711 on its top edge 71 at positions corresponding to the two clipping parts 61, and also is configured with hollow sections 721 at positions corresponding to the two first hooks 611, whereas each of the hollow sections 721 is formed penetrating the circuitboard 70.

Figure 10:
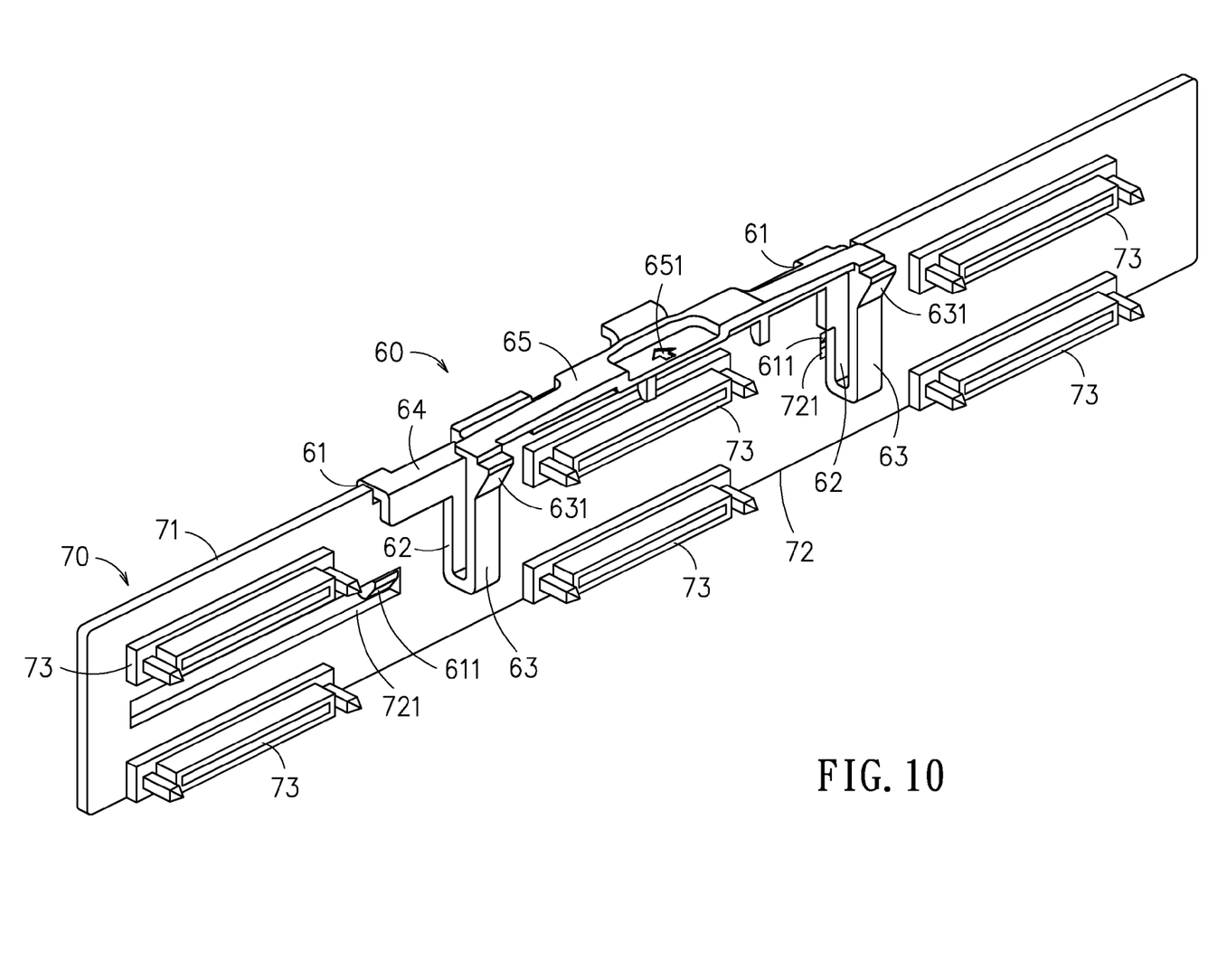
FIG. 10 is a three-dimensional diagram showing the circuitboard fixing structure of FIG. 8.

As shown in FIG. 8 to FIG. 10, when the clamp 60 is clipped to the circuitboard 70, the clipping parts 61 and the fixing parts 62 are arranged straddling across the top edge 71 of the circuitboard 70 at positions corresponding to the recesses 711 while enabling the first hook 611 to couple to the hollow section 721, so that the clamp 60 can be securely integrated with the circuitboard 70 as a unit. Similarly, during the assembling of the clamp 60 and the circuitboard 70, the elastic part 63 of the clamp 60 must be orientated in a position corresponding to the side surface of the circuitboard 70 where the connectors 73 are mounted, and thus, for ensuring and enhancing the correctness of the assembly, there is an arrow mark 651 formed on the second connecting rod 65 for indicating the correct direction of installment. It is noted that the detaching and engaging of the assembly of the clamp 60 and the circuitboard 70 to the server base described in the present embodiment is the same as those shown in FIG. 4 to FIG. 7. Although there are two elastic parts 63 in the clamp 60 of the present embodiment, but since the two elastic parts 63 are connected with each other by the second connecting rod 65, the second connecting rod 65 can be treated and used the same as the second plate 132 of FIG. 1. Thus, when the second connecting rod 65 is being pushed, the two elastic parts 63 will be brought along to move in synchronization toward their corresponding fixing parts 62, and thus force the two second hooks 631 to disengage from the HDD cage 40 in a manner the same as the detaching of the second hook 131 from the HDD cage 40 that is shown in FIG. 6.

To sum up, the present invention provides a circuitboard fixing structure with integrally formed clamp, that is featured not only for its simplicity in structure and easiness of installment, but also for its capability of fixedly securing a circuitboard while allowing the circuitboard to be detached conveniently. For those small circuitboards, a design of single clipping part as the embodiment shown in FIG. 1 is sufficient, but for those large circuitboard, it is preferred to use a design of parallel-connected clipping parts as the fixing structure with two clipping parts that is shown in FIG. 8. However, there can be more than two clipping parts to be configured in the circuitboard fixing structure of the invention if required.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A circuitboard fixing structure, adapted for fixing circuitboards inside an insert formed on the rear of a cage, comprises:
    a circuitboard, formed with a top edge and a bottom edge while being configured with at least one fastener, and provided to be inset into the insert formed on the rear of the cage; and
    a clamp, configured with at least one clipping part, at least one fixing part and at least one elastic part;
    wherein, the clipping part is coupled to the fixing part at their tops while the fixing part is coupled to the elastic part at their bottoms; the clipping part has a first hook formed at a surface thereof facing toward the fixing part; the elastic part has a second hook formed extruding out form a surface thereof facing away from the fixing part; the clipping part and the fixing part are arranged straddling across the top edge of the circuitboard while enabling the first hook to couple to the fastener of the circuitboard; and the elastic part is arranged facing toward the cage while enabling the second hook to engage with and thus couple to the inner surface of the top side of the cage.

2. The circuitboard fixing structure of claim 1, wherein each clipping part is formed with a flange at the top thereof while enabling the flange to protruding out of a surface of the clipping part facing away from the corresponding fixing part.

3. The circuitboard fixing structure of claim 2, wherein the flange is a plate-like structure, being formed extending from the top of the clipping part while enabling an included angle of 90 degrees to be formed between the plate-like structure and the clipping part.

4. The circuitboard fixing structure of claim 1, wherein each elastic part is configured with a triggering element, provided for receiving a force to be used for forcing the elastic part to move and thus enabling the second hook to detach from the bottom surface of the cage.

5. The circuitboard fixing structure of claim 4, wherein the triggering element is a plate-like structure, being formed extending from the top of the elastic part and protruding out from a surface of the elastic part facing toward the fixing part while enabling an included angle of 90 degrees to be formed between the plate-like structure and the elastic part.

6. The circuitboard fixing structure of claim 1, wherein the circuitboard has at least one recess formed on the top edge thereof, provided for the portion where the clipping part and the top of the fixing part are connected to wedge therein; and the fastener is formed as part of the bottom of the circuitboard so as to be provide for the first hook to coupled thereto.

7. The circuitboard fixing structure of claim 1, wherein the circuitboard has a slot formed at the bottom thereof to be used as the fastener.

8. The circuitboard fixing structure of claim 1, wherein the circuitboard has a hollow section formed penetrating the circuitboard so as to be used as the fastener.

9. The circuitboard fixing structure of claim 1, wherein the clamp is configured with two clipping parts, two fixing parts and two elastic parts; the tops of the two clipping parts are coupled to the tops of the two fixing parts in respective through a first connecting rod; the first connecting rod is formed with a first extending length, and following the extending direction of the first connecting rod respectively at the two sides of the first connecting rod, there are two side sections being defined that are opposite to each other while enabling the two clipping parts to be disposed at one of the two side sections and the two fixing parts to be disposed at the opposite side section; the two elastic parts are connected respectively to two fixing parts while enabling the tops of the two elastic parts to coupled to each other through a second connecting rod; and the second connecting rod is formed with a second extending direction while extending in a direction parallel with that of the first connecting rod.

10. The circuitboard fixing structure of claim 9, wherein the two clipping parts are spaced from each other by a first interval while the two fixing parts are spaced from each other by a second interval, and the first interval is not equal to the second interval.

* * * * *